United States Patent [19]

Pithouse et al.

[11] Patent Number: 4,639,545

[45] Date of Patent: Jan. 27, 1987

[54] RECOVERABLE ARTICLE FOR SCREENING

[75] Inventors: Kenneth B. Pithouse, nr. Swindon Wiltshire; Thomas P. H. Jones, Cirencester; Frank J. Lowe, Freshbrook; Richard S. Skipper, Highworth Wiltshire, all of United Kingdom

[73] Assignee: Raychem Limited, London, England

[21] Appl. No.: 698,303

[22] Filed: Feb. 5, 1985

[30] Foreign Application Priority Data

Feb. 7, 1984 [GB] United Kingdom ................ 8403203

[51] Int. Cl.$^4$ .............................................. H01B 7/34
[52] U.S. Cl. ................................ 174/36; 139/425 R; 174/117 M; 174/DIG. 8; 428/259
[58] Field of Search ............... 174/36, 35 MS, 117 M, 174/DIG. 8; 87/9; 66/170; 428/36, 223, 259, 229; 139/425 R

[56] References Cited

U.S. PATENT DOCUMENTS

| 3,217,091 | 11/1965 | Walker | 174/73 R |
| 3,253,618 | 5/1966 | Cook | 174/DIG. 8 |
| 3,466,210 | 9/1969 | Wareham | 174/DIG. 8 |
| 3,467,761 | 9/1969 | Plummer | 174/36 |
| 3,669,157 | 6/1972 | Woodall, Jr. et al. | 174/DIG. 8 |
| 4,375,009 | 2/1983 | Fearnside et al. | 174/36 |

FOREIGN PATENT DOCUMENTS 56393  5/1977  Japan .............. 174/DIG. 8

Primary Examiner—Arthur T. Grimley
Assistant Examiner—Morris H. Nimmo
Attorney, Agent, or Firm—Ira D. Blecker

[57] ABSTRACT

A recoverable fabric for example a weave having a conductive metal warp and a recoverable polymeric weft may be provided with solder to provide an article for screening electrical components.

14 Claims, 4 Drawing Figures

RECOVERABLE ARTICLE FOR SCREENING

The present invention relates to the provision of an electrically conductive surround capable of providing screening against electromagnetic interference (EMI), but which is also useful for other electrical purposes. For convenience the invention will be primarily described in terms of EMI screening.

Often it is desirable to provide electrical equipment, whether a simple cable or something more complex, with an electrically conductive surround in order to prevent interference between that equipment and the environment. This may be done for example to protect the equipment from electrical, magnetic or electromagnetic interference or to prevent that equipment affecting other equipment.

The surround must be electrically conductive, the degree of conduction depending on the extent of electrical protection required, and may also need to be flexible, to provide some degree of environmental protection and to be capable of installation over a range of sizes of equipment. The relative importance of these requirements has determined the type of EMI screening provided.

Three general types of EMI screening may be mentioned. A continuous metal tube or box, for example, may be provided around a conductor or other electrical component to be protected. This will give excellent screening, but will not in general be flexible and must be purpose-made for a particular size of equipment. In order to provide flexibility, a metal tape may be wrapped around the electrical cable to give the cable some flexibility thus allowing the cable to bend. This increase in flexibility may however result in a decrease in shielding performance since bending of the cable may cause adjacent layers of the tape wrap to part. A tape wrap also has the advantage of being installable over virtually any size or shape of electrical equipment.

One of the most useful ways, however, of providing screening is by means of a metal braid. Braids are flexible, robust, can be extended or compressed to decrease or increase their diameter, and provide a good screening performance.

Nonetheless, a problem may arise where the electrical component (or a casing or insulation around it) is of irregular shape, or where it is desirable that one size of screen be suitable for a range of sizes of electrical components, or where the screen is to be installed snugly into engagement with the component; this is especially true in the case of a braid where only limited changes in diameter can be achieved with resulting longitudinal changes.

Two instances may be mentioned where dimensionally recoverable articles have been used to provide shielding in a way that can overcome these problems. GB No. 1470049 discloses a hollow heat-recoverable member having at least one open end and a metal braid and a quantity of solder within the hollow member. Such an article can be used to join together the outer conductors of two co-axial cables. A hollow recoverable article is also disclosed in GB No. 2113022, but here a metal layer is adhered to the surface of the article. The adhered layer has a number of grooves extending perpendicularly to the direction of recovery which allow the article to recover without the adhered layer cracking.

Such articles can produce excellent screening but for some configurations may be difficult or expensive to produce, and disadvantages may occur in some circumstances where high recovery ratios are required.

We have discovered that a recoverable fabric having therein conductive fibres, particularly metal fibres (which fabric is known per se), may be adapted for protection against electrical interference.

Thus, the present invention provides an article capable of screening an electrical component, which comprises:

(a) a recoverable fabric having as a component thereof fibres comprising an electrically conductive material; and (b) means for electrically terminating said fibres; said article after recovery having a surface transfer impedance of 5 ohm/m or less, measured over a frequency of from 1–50 MHz.

The invention also provides a method of screening an electrical component, which comprises:

(a) positioning around the component a recoverable fabric having as a component thereof fibres comprising electrically conductive material;

(b) electrically terminating said fibres to a screen; and (c) recovering the fabric to secure it around the component.

The invention further provides an electrical system which comprises:

(a) an electrical component (b) a recoverable fabric around the electrical component, said fabric having as a component thereof fibres comprising electrically conductive material; and (c) an electrically insulating material positioned so as to isolate an electrically active part of said component from the conductive material of the fabric.

The fabric of the electrical system is preferably fabricated from its constituent fibres, especially by weaving, around the electrical component. The electrical component preferably comprises a cable, and the material (c) preferably comprises the cables own insulation. The fabric may be constructed such that on recovery the bundle of conductors to be screened is compacted.

The structural properties of the fabric will be considered first, and then preferred electrical properties will be mentioned.

The fabric may be any fabric, for example a weave, a knit, a braid or a non-woven fabric. Weaves and knits including circular knits and warp knits are, however, preferred. Where a weave is used, we prefer that fibres in one direction provide the conductive material and fibres in the other direction are recoverable. In particular, we prefer that substantially all of the fibres in one direction are conductive, and substantially all of the fibres in the other direction are recoverable. It is of course possible that fibres which are both conductive and recoverable be provided in one or both directions. For example, in the case of a fabric sleeve (whether manufactured directly as a tube or first as a sheet), recovery will generally be required only in the radial direction, but some longitudinal recovery may be useful for drawing together two components to be screened, or for eliminating wrinkles where the fabric covers irregularly shaped components. These comments relate primarily to weaves having warp and weft perpendicular, but similar comments apply to other weaves such as triaxial weaves. Possible weave designs include twill, broken twill, satin, sateen, leno, plain, hop sack, sack, matt (basket) weave and various weave combinations in single or multiple-ply weaves, for example two or three ply weaves.

It can be advantageous to construct the fabric in more than one layer. Two layers of woven metal results in improved optical coverage (explained in more detail below) and consequentially gives improved screening performance, especially at high frequencies for example above 1 MHz particularly above 10 MHz. The two layers may be provided by laminating together two layers of fabric, or a true multi-layer weave may be provided as mentioned above. The material constituting the various layers may be the same or different. For example, a multi-ply weave could employ one warp layer for strength and second conductive warp layer for screening. Also, multi-layer weaves can combine a high conductive material content with a high level of recoverable fibres. A large number of functionally independent layers, say up to about 8, may be provided. Furthermore, it may be useful to incorporate a non-conductive layer over a conductive layer. This non-conductive layer can provide increased mechanical performance and/or improved bonding between any layers present, or where the additional layer has a high recovery force, improved engagement between the various layers and an underlying substrate may result. Multiple layer weaves can often enhance flexibility whilst retaining high optical coverage, and therefore screening performance, during flexing or other deformation. The various layers may be interlaced at sufficiently small spacial intervals to ensure that conductive material in one layer maintains the correct position relative to conductive material in another layer, whilst allowing the whole structure to retain a high degree of flexibility. A jacket of non-perforate material may be provided around the fabric to retain any softenable or meltable sealing material (such as an adhesive or solder) which may otherwise flow through the interstices of the fabric on recovery, particularly on heat recovery. Such non-perforate layer is preferably provided as an outer layer. A jacket or other continuous layer may form during installation of the product, by amalgamation of a component that melts or softens when heated.

The invention offers particular advantages due to the separation of the conductive and recovery functions. Thus, localization of the conductive component as fibres arranged in one direction does not inhibit recovery in the perpendicular direction. It follows that the amount of recoverable material can be reduced whilst retaining a sufficient recovery force. In short, a more flexible and lighter product can provide equivalent screening performance.

A further advantage of a fabric is ease of production, especially for hollow articles where insertion of a braid or internal deposition of a metal layer may be difficult. In general, the fabric may be formed in any desired configuration, and in particular may be hollow for example in the form of a tube or a more complex article having two, three or more outlets, or an end cap, produced for example by warp knitting. Y-shaped hollow articles may be knitted having a recovery ratio of at least 2:1 and a screening effectiveness of better than 50 dB, particularly better than 60 dB. When the fabric has a hollow form having two or more outlets it may desirably be of the wrap-around type such that it can be installed without access to a free end of the component to be surrounded. Some form of closure mechanism is then preferably provided with the fabric. The closure mechanism may comprise an adhesive for example a pressure-sensitive adhesive. The fabric may comprise first and second parts joined together by means which electrically connects together the conductive material of the first and second parts. Metal staples or metal thread to form stitches, for example, may be used. In general, stitching or stapling may be used to make shaped articles.

In order to cover substrates of varying size, the recovery ratio of the fabric is preferably at least 20%, more preferably at least 50% especially at least 66%, for example 66% to 75%, which figures relate the change in a dimension to that dimension before recovery. The fabric may be laminated with a polymeric material, which preferably renders the fabric substantially impervious, in which case the recovery percentage will generally be reduced slightly.

The fibres used to render the fabric recoverable preferably recover by at least 50%, more preferably at least 75%, especially at least 85%. The fabric does not, of course, recover to the same extent as the free fibres of which it is composed. The material chosen for the fibres will depend on the desired recovery temperature, recovery force, and recovery ratio. Polyethylene is preferred (recovery temperature about 120°–150° C.), although polyester or nylon, for example, may be used where higher recovery temperatures are needed. An alternative material is a fluoro polymer such as polyvinylidene fluoride (Kynar, trade mark) which, due to its temperature resistance, is ideal for use with solder. The polymeric material used for the recoverable fibres may be cross-linked to improve their heat stability and to improve their post-recovery strength, and additives such as anti-oxidants and stabilizers may be included. Cross-linking may be carried out chemically or by irradiation. A radiation dose of 2–20 Mrads, typically resulting in a gel content of at least 30% especially at least 40%, may be regarded as usual. These figures apply particularly to polyethylene, and the precise values for other polymers may be determined by the skilled man.

The fibres which provide conductivity may consist entirely of conductive material or may have only a core or a coating or intermediate layer or a dispersion of conductive material. An example of the third of these types is an aluminium or other metal-coated glass fibre. The conductive material may be, for example a conductive polymer such as a polymer loaded with carbon black, but will preferably be a metal due to the lower resistivities of metals. The magnetic permeability of the material will be important where screening against magnetic induction is to be provided. These fibres may be single metal strands or multi-strand filaments, either alone or in combination with a metallic or non-metallic core, and may have any cross-sectional shape for example circular or rectangular.

Where a metal is used, it is preferably copper, silver, gold, tin, lead (e.g. a tin/lead solder to produce for example a coalesced layer after heat-recovery), aluminium, nickel or a ferrous metal, and most particularly copper or silver due to their high conductivities, or mumetal (Trade Mark) due to its high permeability. It may be desirable that electrical contact occurs between the conductive fibres at one or more points along their length, in which case the fibres desirably have an enhanced oxidation resistance surface, an example of which is tinned copper. In addition, it has been observed that the provision of a surface layer of tin significantly improves high frequency screening effectiveness (e.g. above about 1 MHz) possibly due to the high elongation to break of tin which is therefore capable of bridging small cracks which may otherwise occur. This problem is unlikely to be noticed in the article of the present invention due to the high flexibility of fabrics, but it may be a desirable feature when electrical components of highly irregular shape are to be screened, or when moving parts or parts subject to vibration or sharp edges are to be screened.

The skilled man will be able to determine the particular weave design that is best for his particular application. We have found that the weave design is not critical within certain limits, but that some variation in screening performance results from the size and density of both the conductive and non-conductive fibres. A quantity which may be considered here is the optical coverage of the fabric by the conductive material, which simply means the percentage of the area of the fabric which in plan view is occupied by conductive material. For high optical coverage, the screening performance varies little with optical coverage but is dependant on the configuration of the fibres. In general, the optical coverage will increase as the fabric shrinks and the following preferred values should be taken as applying after shrinkage: a value of at least 50% is preferred, especially at least 75%, more especially at least 85%. Where the value is initially low, a significant improvement in screening performance may be noticed recovery. In such a situation, the initial size may be chosen such that a significant extent of recovery is required for complete installation.

Where the fabric is to be used in significant length in a direction perpendicular to the direction of recovery (as is the case for example of a long radially recoverable sleeve for cable screening) it may be desirable that either the conductive fibres do not all run parallel to the length of the tube or that some electrical connection is provided between adjacent conductive fibres at repeated spacings along the length of the sleeve. The reason for this is that the conductive fibres will otherwise act as an aerial for radiation of a certain frequency, the value of that frequency depending on the length of the electrically independant conductive fibres. For the frequencies one is generally concerned with this may become a problem where the fabric sleeve has a length of about 1 meter, or multiples thereof. A preferred method of overcoming or alleviating this problem is to arrange the conductive fibres in a shallow helical path around the circumference of the sleeve. The conductive fibres could be woven at an angle to the recoverable fibres in order to achieve this, or the fabric can be installed in such a way that the fibres run helically. In the case of a fabric sleeve, the sleeve could be twisted before recovery. These techniques will also provide the installed product with greater flexibility as regards longitudinal bending.

The means for electrically terminating the conductive material will now be considered. Where an electrical component is to be screened it is in general necessary completely to enclose that component and any other component electrically connected thereto by a screen. In general, the fabric of the invention will provide only part of the total screen, and some form of housing or connector shell or further cable screen will also be involved. Thus, some means has to be provided to provide electrical continuity between the conductive component of the present fabric and a continuation of the screen. In some circumstances a single piece of fabric may be used to provide all the screening that is required, and the means for terminating will therefore simply connect conductive material of one part of the fabric to that of another part of the fabric. The present claims cover this possibility. The means for terminating may terminate one or some only of the conductive fibres (the conductive fibres being in electrical contact with each other elsewhere) or it may terminate all of them. It is preferred that the means for terminating carries out both functions of connecting the conductive fibres to the continuation of the screen and also of connecting the fibres together.

Three broad types of means of terminating may be described: mechanical, recoverable and termination by means of a sealing material or other coating.

The mechanical means may be a clamp, for example a jubilee clip or other type of hose clamp which, in a preferred embodiment, serves to engage a portion of the fabric to an underlying member. The clamp is preferably made from a conductive material, such as a metal. Such a clamp may serve also to provide a mechanical join between the fabric and the continuation of the screen, thereby providing strain relief by means of the fabric across the component to be screened.

A recoverable means for terminating may comprise a recoverable driver sleeve, ring, or other means, which causes the fabric to engage the continuation of the screen. Such an additional recoverable sleeve will in general be required because the force exerted by unit area of the recoverable fabric itself will not be great enough to ensure good electrical contact. The reason for this is that in order to achieve good screening a high quantity of conductive material is desirable and in the case of single layer weaves, this generally will be provided at the expense of the quantity of recoverable material. The recoverable fibres may therefore be spaced too far apart.

A sealing material may provide the termination by improving electrical conduction between the conductive fibres and the continuation of the screen. In this case, the recovery force exerted by the fabric may be sufficient. The sealing material may be uniformly positioned over the surface of the fabric or it may be localized, for example at ends of the fabric where connection to a back-shell etc. is to be made, or in the case of a wrap-around fabric it may be localized at the edge portions which are to be brought together. Suitable sealing materials include solder (by which we mean any metal or alloy of suitably low melting point, such as 80°-250° C., for example a eutectic mixture), conductive sealants for example mastics, or conductive adhesives for example heat-activatable adhesives. Solder may be applied dispersed in a flux, preferably as a formulation having the consistency of a cream, in which case it can be smeared or otherwise applied around the underlying substrate, either directly or on a separate carrier layer. A thinner layer, such as a conductive paint, may additionally or alternatively be used. The solder or adhesive may be incorporated into the fabric for example by weaving or knitting fibres of solder or adhesive, or it may be applied by a coating technique (such as dipping) or it may, at least initially, be a discrete component such as a solder or adhesive ring or a carrier such as a fabic strip embedded with solder or adhesive. Alternatively it may initially be applied to the substrate in another form such as a cream as mentioned above. The solder or adhesive may penetrate the interstices of the fabric after installation, and if desired also before installation. A preferred way of rendering a sealant or an adhesive conductive is by loading it with a metal, for example silver. The sealing material is preferably heat-activatable by softening or melting so that its contact with the fabric increases as the fabric recovers. Alternatively, or additionally the sealing material may comprise reactive components, and may be provided as a component of the fabric. Where the fabric is heat-recoverable, a single heating step preferably causes both recovery of the fabric and activation of the sealing material. The difference between the recovery temperature and activation temperature is preferably 20° C. or less, more preferably 10° C. or less. Where high melting point solders (or adhesives) are desirable a polymer such as a nylon or polyester having a high recovery temperature may be chosen for the recoverable fibres.

Further consideration may be given to the use of solder in conjunction with a fabric, whether for screening or not and whether or not the fabric is recoverable. It may be desirable to incorporate solder into a fabric to produce a unitary article. Solder as presently available, however, cannot be woven, knitted or braided and it is believed that no suggestion has been made that this would be a useful thing to do. We have now discovered that it is possible to reinforce solder to produce a fibre which has sufficient flexibility and strength that it may be woven etc. into a fabric and still be able to provide a reliable joint between that fabric and another article when heated.

Thus, the invention further provides a fibre capable of being woven, knitted or braided and comprising solder and a longitudinally extending reinforcement therefor. The invention still further provides a fabric, preferably a recoverable fabric, having solder woven, knitted or braided therein. The solder preferably has a flux pre-incorporated therein. Alternatively, the fabric itself may carry the flux.

Three ways of providing such reinforcement may be mentioned. Firstly a solder fibre may be encased within a braided (or other fabric) tube, made preferably of a plastics material but optionally of metal. The plastics material, such as a polyester or polyolefin and optionally cross-linked, may be heat-shrinkable such that on heating, activation of the solder is accompanied by its displacement through the interstices of the braid due to shrinkage or melting of the braid. Secondly, a reinforcing fibre and a solder fibre may be twisted together, for example as a simple twisted pair or as a fine helical solder wrap around the reinforcing fibre, which may be of plastics material or metal. A third possibility is that the solder may be impregnated or otherwise incorporated within or coated on a carrier fibre.

The reinforced solder fibre may in part constitute at least a portion of the fabric after installation of the fabric (i.e. after the solder has been activated). In that situation the reinforcement should retain some integrity after heating. This may not, however, be necessary and the reinforced solder may be provided merely as solder, the reinforcement simply existing for the purpose of the initial incorporation of the solder into the fabric.

Where the fabric is to be recoverable, the reinforcement of the solder may provide at least some of the recoverability. Analogously, where the fabric is to provide screening, at least some of the screening may result from conductivity of the reinforcement in addition to that of the solder. Both of these possibilites may of course obtain, for example in respectively circumferential and longitudinal fibres of a sleeve.

Alternatively, recoverability and/or screening may result from fibres of the fabric other than the reinforced solder. In general, we prefer that the reinforced solder be incorporated into the fabric (by weaving or soldering etc.) at only those locations where attachement to another article (or attachment together of two parts of the fabric) is required. For example a hollow article for screening may comprise a sleeve having longitudinal metal fibres, circumferential recoverable fibres present along its entire length, and solder localized at the ends of the sleeve for electrical and mechanical connection to, for example, the screens of adjacent articles. The localized solder may be provided by weaving into the fabric what will become circumferential fibres at the ends of the sleeve or by adding to the longitudinal screening fibres (such as by twisting therewith) solder over the appropriate parts of their length prior to weaving.

We now turn to a consideration of the electrical or magnetic properties desirable in the fabric. They will clearly depend on the intended use of the fabric. Although the invention relates to any purpose for which series of conductors is positioned around an electrical component to provide a conductive path of specific configuration, the following uses may be mentioned: initial screening of cables, especially multi-core cables and flat cables; repair to existing cable screens; screening of cable branch-offs, for example in harnesses; screening of cable splices; screening of cable connectors; providing cable screening and armouring; providing lightening strike protection; providing current paths especially where flexibility is required; and providing intentional induction of current.

Where a simple current path is required the primary consideration will be the total resistance or impedance of the conductive fibres and the means for terminating.

Where, however, protection against interference is to be provided, the nature of the interference and a way of measuring the extent of protection must be considered. The three basic mechanisms of leakage associated with cables and other electrical components are electrostatic induction, magnetic induction, and electromagnetic induction. The main source of interference, at high frequencies at least, is electromagnetic induction, and the ability of a recoverable fabric to screen in this respect will be discussed. The reader is directed to a document entitled "Optimised and Superscreened Cables" published by Raychem Ltd, Faraday Road, Dorcan, Swindon U.K. which describes a known technique for assesing screening perforamnce. It is now generally accepted that screening performance may be measured by surface transfer impedance ($Z_T$). In terms of a cable, this relates the open circuit voltage generated inside the cable sheath to the current flowing on the outside. The unit of $Z_T$ is ohm/m, and the voltage coupling is therefore length dependant, a long cable exhibiting more leakage than a short one. The value of $Z_T$ will be frequency dependant, and a value at 30 MHz will give a particularly useful indication of performance.

The following test method is an adaptation of I.E.C. 96 and B.S. 2316. A tube of the fabric is recovered about a length of a tubular dielectric material having a central conductor along its length. A high frequency current is passed along the conductive fibre component of the fabric via the chosen means for electrically terminating the fibres. The voltage induced in the central conductor is measured after amplifying it in a low noise amplifier.

Such a set-up mirrors the effect of incident electromagnetic radiation on the fabric.

The results of this measurement, expressed in terms of surface transfer impedance ($Z_T$), may be related to screening effectiveness (SE) in decibels by the following expression $$SE\ (dB) = 20\ \log_{10} Z_T/Z_O + 20\ \log(2r/L)$$

Where $Z_T$ is the recorded surface transfer impedance (ohms)

$Z_O$ is the impedance of free space (337 ohms)

r is the radius of the fabric tube (meters)

L is the length of the tube (meters).

We prefer that the surface transfer impedance measured in this way is 5 ohm/m or less, preferably 500 mohm/m or less, more preferably 60 mohm/m or less especially 40 mohm/m or less, particularly 10 mohm/m or less.

These values preferably apply at 30 MHz, more preferably over a range 1 MHz–50 MHz especially 10 KHz–100 MHz, more especially 1 KHz–1 GHz.

In general, the value of $Z_T$ does not vary unacceptably with weave (or knit etc.) design so long as the optical coverage is at least say 50% for a given conductive fibre diameter in a fabric (e.g. woven) of given picks per cm and ends per cm and the resistivity of the conductive fibres 1 ohm cm or less, especially $2 \times 10^{-3}$ ohmcm or less, or more especially $10^{-4}$ ohmcm or less. The diameter of the conductive fibres, where circular, for most applications is preferably 0.02–5 mm, more preferably 0.1–1 mm, and the diameter of the recoverable fibre(s) before recovery is preferably 0.02–5 mm, more preferably 0.1–1 mm. Where multi-filament fibres are used, these figures refer to the overall size of the multifilament. A greater amount of conductive material with less separation between adjacent conductive fibres (viewed in plan and/or in end elevation) can be realized if the conductive fibres have a high degree of crimp and the recoverable fibres have a low degree of crimp. The high degree of crimp means that a greater length of conductive fibre is required, and additionally the continually changing direction of the crimped metal fibres also has a beneficial effect. The lack of crimp in the recoverable fibres allows the conductive fibres to move close together, preferably to allow electrical contact when the fabric recovers. These beneficial effects are noticed when the recoverable fibres have substantially no crimp and when the conductive fibres have at least 1%, especially at least 3%, particularly at least 5% crimp. These values will depend on the weave design and on the size of the fibres etc., but they may regarded as typical for preferred fabrics. The crimp is measured as the difference in the length of a fibre in the fabric and its length if it were removed from the fabric and straightened under a specific tension, expressed as a percentage of its length in the fabric. Where the fabric is woven as a tube, better screening performance has been noted with conductive fibres as longitudinal warp, and recoverable fibres as circumferential weft. Here, crimp in the longitudinal (conductive) fibres is beneficial for an additional reason: some longitudinal bending ability of the fabric tube may be desirable and crimp may allow such bending without fibre damage occurring. For this purpose at least 5%, particularly at least 8%, especially at least 10% crimp may be provided. Improved screeninq results after recovery, particularly after only partial recovery, have also been noted when the fabric is provided with a polymeric material as a laminate, and this is thought to be due to a more uniform recovery. Such a laminate may take the form of an external environmentally protecting jacket or as an internal layer for improved sealing or for electrical insulation. Where such an insulating layer is provided, the article of the invention could be used directly to screen a bare conductor. The laminate may be recoverable, but where it is thin it may be able to be deformed under the recovery forces of the fabric, especially if it softens under the heat required for heat-recovery. A thickness of laminate of from 0.1–10 mm is preferred. In some circumstances the laminating material may be cross-linked to improve its high temperature performance, or to improve its ability to recover, or its stability during installation. A laminating material may be provided on both sides of fabric, and it may be a mere coating or it may enter the interstices of the fabric.

The invention is illustrated by the accompanying drawings, in which:

FIG. 1 shows part of a fabric being woven by a shuttle technique in a plain weave from a recoverable weft 2 and a conductive warp 3. The crimp is shown entirely in the warp.

Figure 1:
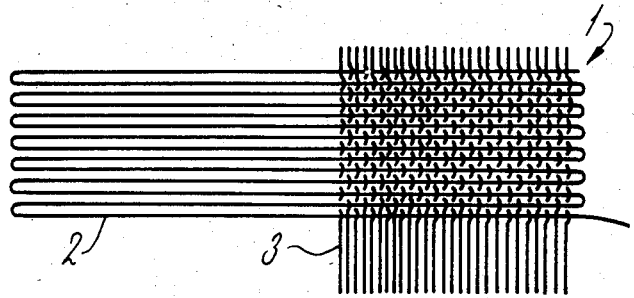
FIG. 1 shows a fabric.
Figure 2:
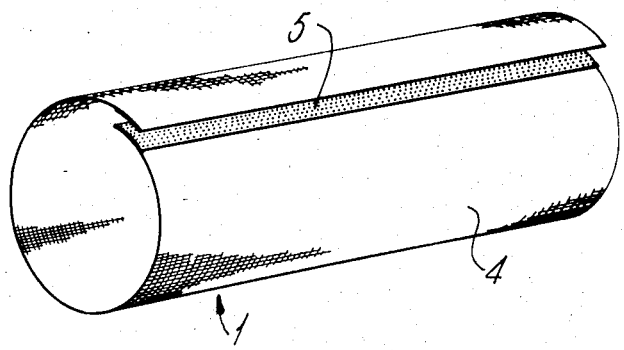
FIG. 2 shows a wrap-around sleeve.

In FIG. 2 the fabric 1 is in the form of a wrap-around sleeve 4, having closure means 5. The closure means shown is a simple frictional closure of the velcro (Trade Mark) type. Where recovery forces are significant a stronger closure for example stitching, stapling or a rail and channel type closure (see GB No. 1155470) may be used.

Figure 3:
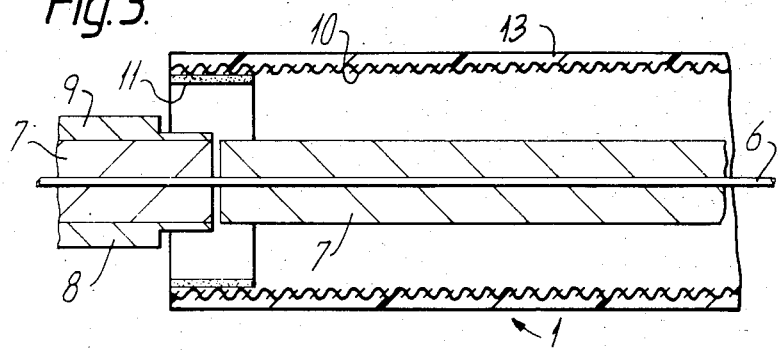
FIG. 3 shows a partially installed fabric.

FIG. 3 shows a conductor 6 which is to be protected from electrical interference, or which is to be screened to prevent it from inducing interference in other electrical components. The conductor 6 is surrounded by a dielectric 7 and enters a back-shell or other housing 8. The housing 8 has an inner dielectric 7 and an outer conductive layer 9. The fabric 1, in the form of a tubular sleeve 10 is positioned around the conductor and then recovered to secure it by engagement with the dielectric. The fabric has means 11 for terminating the conductive fibres thereof. The means 10 shown is a solder or conductive adhesive layer, which will provide electrical contact with the outer conductive component 9 of the housing 8. The means for terminating could be a mechanical clamp which may, for example, be provided as a part of the housing 8. The fabric may additionally comprise a laminate 13 of a polymeric material, thereby rendering the fabric impervious.

Figure 4:
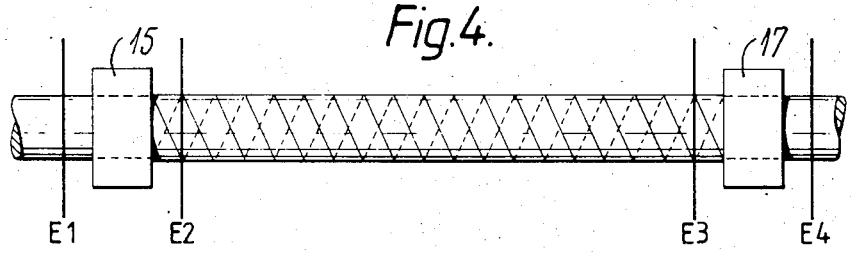
FIG. 4 shows a fabric used for electrical continuity.

FIG. 4 shows a woven metal tube, 30 cms in length, recovered onto a copper pipe of 15 mm diameter. A 10 amp current was passed down the tube and the resistivities measured at the points E1–E4. This was repeated for different means for electrically terminating the matal of the tube. The pipe pull-out force was also measured and the results are shown in the table below. This shows that the article of the invention may be used for providing electrical continuity. Electrical continuity may be provided between components of different sizes or irregular shapes or where relative movement occurs between the components to be connected. An example is a high voltage connection between a spark plug and a high voltage terminal. Shown schematically in FIG. 4 are means for terminating the fibers. These means may be, for example, a mechanical clamp 15 or a recoverable driver member 17.

| | Resistivities (Milli-ohms) | | | | Pipe Pull-out force (Newtons) |
|---|---|---|---|---|---|
| Termination | E1-E4 | E1-E2 | E3-E4 | E2-E3 | |
| Woven Tube recovered onto copper pipe-no driver | 0.853 | 0.097 | 0.112 | 0.644 | 17 |
| Tube recovered with SCL adhesive lined driver | 0.831 | 0.074 | 0.109 | 0.648 | 235 |
| Tube recovered with Kynar driver(no adhesive) | 0.876 | 0.111 | 0.096 | 0.668 | 70 |
| Tube recovered soldered to copper pipe | 0.797 | 0.080 | 0.084 | 0.631 | 1300 |

The following Examples further illustrate the invention. In the Examples, the surface transfer impedance ($Z_T$) was measured by the technique described above. In each of the Examples other than Example 7 the conductive material of the fabric under test was electrically terminated to the screen of the test jig by soldering.

EXAMPLE 1

This example illustrates the effect of different weave designs on screening performance. In each of the weave designs considered the warp was a conductive tinned copper wire of 32 a.w.g, and the weft was a high density polyethylene monofilament 0.18 mm diameter cross-linked by an irradiation dose of 20 Mrad. Each fabric was fully recovered onto a test jig where the surface transfer impedance ($Z_T$ mohm/m) was measured over a range of frequencies.

The weaves before recovery had the following characteristics:
Weave A: Plain weave,
  96 warp ends/inch (37.8 ends/cm)
  10 weft insertions/inch (4 insertions/cm)
  Recovery ratio 1.58:1
Weave B: 3 up 1 down Twill,
  31 warp ends/inch (12.2 ends/cm)
  Each warp end consisted of three wires
  12.8 weft insertions/inch (5 insertion/cm)
  Recovery ratio 1.50:1
Weave C: Sateen 5 harness, 2 counter
  25 warp ends/inch (9.8 ends/cm)
  Each warp end consisted of three wires
  12.8 weft insertion/inch (5 insertion/cm)
  Recovery ratio 1.9:1
Weave D: Two ply fabric sheet,
  In the first ply each end consisted of three copper wires Second warp Multifilament rayon (Trade Mark) 2440 decitex
  Warp densitives of first and second plies 18.5 ends/inch (7.3 ends/cm)
  27 weft insertions/inch (10.6 insertion/cm)
  Recovery ratio 2.2:1

The screening performance of these four weaves is given in Table 1, which shows little variation in performance with weave design.

TABLE 1

| Frequency (kHz) | $Z_T$ (mohm/m) | | | |
|---|---|---|---|---|
| | Weave (a) | Weave (b) | Weave (c) | Weave (d) |
| 1 | 10.4 | 9.63 | 10.8 | 8.86 |
| 100 | 4.26 | 3.49 | 4.21 | 3.20 |
| 1000 | 6.04 | 2.22 | 6.14 | 4.54 |
| 10000 | 17.8 | 5.13 | 14.8 | 12.4 |
| 30000 | 24.1 | 12.05 | 25.2 | 25.0 |

EXAMPLE 2

This example shows the effect of crimp in the conductive fibres on the screening performance of a fabric. Two (woven) fabrics were made by weaving in a plain weave 32 a.w.g. tinned copper wire, and high density polyethylene monofilament of diameter 0.2 mm irradiated to a dose of 18 Mrad. In the first of these, weave a, the polyethylene recoverable fibres were used as the warp at a density of 90 ends/inch (35.4 ends/cm), and the conductive metal was used at a weft density of 11 insertion/inch (4.3 insertions/cm), each insertion consisting of three metal wires. All of the crimp occurred in the polyethylene recoverable fibres. In weave b, the metal was used as the warp at a density of 96 ends/inch (37.8 ends/cm), and the polyethylene was used as the weft at a density of 13 weft insertions/inch. (5.1 insertions/cm). In this fabric the crimp occurred totally in the metal fibres. Each fabric was fully recovered onto a test jig, the recovery ratios being 2.88:1 and 1.58:1 for weaves a and b respectively.

The screening performance over a range of frequencies is shown in Table 2.

TABLE 2

| | $Z_T$ (mohms/m) | |
|---|---|---|
| Frequency (kHz) | Weave a | Weave b |
| 1 | 22.9 | 12.9 |
| 100 | 12.8 | 4.7 |
| 1000 | 63.1 | 2.5 |
| 40000 | 2750 | 8.3 |

The superior screening performance of weave b can be clearly seen from the Table, indicating the preference for crimp to be present in the metal. The reason for the better performance is thought to be perhaps because of the greater amount of metal required if the metal is crimped, partly because the crimped metal fibres continually change direction rather than lie in straight lines, but primarily because an absence of crimp in the recoverable fibres allows the metal fibres to move closer together on recovery of the fabric.

The discrepancy between the two values of $Z_T$ at 1 KHz (which values correspond to the DC resistance of the two screens) is probably due to the different quantities of metal that will in general result from the two designs. In the present case the different recovery ratios and different metal fibre types result in similar metal densities after recovery. The differences at higher frequencies are however much larger, and arise from the much greater optical coverage of weave b after recovery.

EXAMPLE 3

Example 3 illustrates the effect of the density of recoverable fibres on screening performance. Various 3 up 1 down twills were woven from cross-linked high density polyethylene weft at various densities, and 32 a.w.g. tinned copper wire warp at a density of 31 ends/inch (12.2 ends/cm), each end consisting of three wires. The fabrics had recovery ratios of about 1.5:1 and were fully recovered onto a test jig for measurement of screening performance. The results are shown in Table 3.

TABLE 3

| Weft Density | $Z_T$(mohm/m) | | | | |
|---|---|---|---|---|---|
| (picks per cm) | 1 KHz | 100 KHz | 1 MHz | 10 MHz | 30 MHz |
| 2.1 | 9.84 | 3.78 | 11.1 | 61.0 | 165 |
| 3.6 | 8.34 | 4.72 | 5.99 | 14.4 | 18.3 |
| 5 | 8.43 | 3.67 | 4.63 | 14.1 | 25.6 |
| 6.6 | 8.20 | 3.02 | 4.67 | 8.49 | 9.83 |
| 7.9 | 8.98 | 3.78 | 4.61 | 10.8 | 17.5 |

It can be seen that the screening performance highly dependent on the density of the recoverable fibres at low frequencies, but substantial (improvement can be seen at high frequencies with increasing density up to a certain value, after which the performance appears to worsen.

EXAMPLE 4

The effect of unresolved recovery on EMI screening was investigated.

Weave B from Example 1 was used, except the pre-recovery warp density was 15 ends/inch (6 ends/cm) and the weft density was 16 picks/inch (6.3 ends/cm). The recovery ratio was 3:1.

Samples were recovered onto test jigs of various sizes, to permit various extents of recovery to occur. The greater the recovery, the greater was the optical coverage of metal in the installed product. The screening performance is shown in Table 4.

TABLE 4

| % Recovery | Approximate optical coverage (%) | $Z_T$(mohm/m) | | | | |
|---|---|---|---|---|---|---|
| | | 1 KHz | 100 KHz | 1000 KHz | 10 000 KHz | 30 000 KHz |
| 0 | 33 | 11.3 | 5.16 | 28.3 | 245 | 740 |
| 25 | 50 | 17 | 7.96 | 17.8 | 143 | 408 |
| 49 | 66 | 8.53 | 3.37 | 6.78 | 39.4 | 133 |
| 58 | 72 | 12.8 | 5.48 | 6.92 | 39.9 | 120 |
| 72 | 81 | 8.20 | 3.61 | 4.26 | 21.8 | 61.7 |
| 87 | 91 | 14.6 | 6.38 | 3.68 | 13.6 | 30.0 |
| 100 | 100 | 9.63 | 3.49 | 2.22 | 5.13 | 12.1 |

Little systematic variation in $Z_T$ occurs at low frequencies with extent of recovery, but a trend becomes apparent at 1 MHz and above.

EXAMPLE 5

This example shows the change in screening performance obtained by providing the recoverable fabric with a matrix of solder. The fabric described under Example 3 having 5 picks/cm was dip coated (after pre-heating) with a bismuth-lead-tin eutectic alloy of melting point 96° C. The fabric, which took up its own weight of solder, had a recovery ratio after dipping of 1.35:1, compared to 1.5:1 before dipping. The before and after screening performance is shown in Table 5.

TABLE 5

| Frequency (KHz) | $Z_T$(mohm/m) | |
|---|---|---|
| | Coated | Uncoated |
| 1 | 6.8 | 9.5 |
| 100 | 2.2 | 3.5 |
| 1000 | 1.3 | 2.2 |

TABLE 5-continued

| Frequency (KHz) | $Z_T$(mohm/m) | |
|---|---|---|
| | Coated | Uncoated |
| 40000 | 3.7 | 15.1 |

It can be seen that screening performance was improved by coating. At low frequencies this is primarily due to the greater conductivity due to the increase in metal, and at high frequencies is also due to the greater optical coverage of the fabric by metal.

EXAMPLE 6

This example shows the screening performance available using tinsel wire instead of a single stranded wire as the conductive material. Tinsel wire consists of a non-metallic core, such as cotton or rayon (Trade Mark) over which is helically wound in overlapping relationship a copper strip. The diameter of the tinsel wire was 0.25 mm and its DC resistivity was 4.5 ohm/m. A fabric was woven in plain weave using this tinsel wire as the warp at a density of 50 ends/inch (19.7 ends/cm), each end consisting alternatively of one and three tinsel fibres. The weft was a recoverable high density polyethylene monofilament 0.18 mm in diameter irradiated to a dose of 20 Mrad, used at a density of 10 insertions/inch, (4 insertions/cm). The recovery ratio of the fabric was 1.75:1. The fabric wsa fully recovered onto a test jig for measurement of screening performance, the results being shown in Table 6.

TABLE 6

| Frequency | $Z_T$(mohm/m) |
|---|---|
| 1 | 24.5 |
| 100 | 15.7 |
| 1000 | 13.7 |
| 10000 | 24.0 |
| 40000 | 62.6 |

EXAMPLE 7

The effect on screening performance of various types of means for electrically terminating the conductive material was investigated. A double layer fabric substantially as described above as weave D in Example 1 was coated on one side with a 0.75 mm thick layer of an ethylene-vinyl acetate copolymer (Elvax 460, Trade Mark, obtainable from DuPont) by press-laminating at 105° C. The difference from weave D was that the fabric was woven as a flat sheet and a 2 cm strip at one warp edge of the fabric employed a double metal layer rather than one metal layer and one rayon layer. This 2 cm strip was not coated with the copolymer. The flat sheet was formed into a wrap-around sleeve by attaching, by means of a curing adhesive parts of a friction fastener of the velcro (Trade Mark) type adjacent each warp edge, such that the sleeve was circumferentially recoverable, and such that the copolymer coating was on the outside of the sleeve. A further feature was that the friction fasteners were so positioned that the edges of the sleeve overlapped, causing the 2 cm uncoated metal layer to be in electrical contact with the metal on the other surface of the fabric. It is to allow such electrical contact that both warp layers of the double layer fabric at one warp edge of the fabric (in this example at both warp edges) are desirably of metal.

The fabric was fully recovered around the test jig, and the conductive fibres terminated to the screen of the jig by the methods shown in Table 7 which also gives the screening performances recorded. The conductive adhesive referred to was a two part epoxy loaded with silver particles to render it conductive having a resistivity 0.01 ohm cm. The control involved no discrete terminating means, but merely made use of the recovery force of the weft to bring the conductive warp into electrical contact with the screen of the test jig.

TABLE 7

| Termination Method | $Z_T$ (mohm/m) | | | | |
| --- | --- | --- | --- | --- | --- |
| | 1 KHz | 100 KHz | 1 MHz | 10 MHz | 30 MHz |
| Jubilee Clip | 13.7 | 10.3 | 55.1 | 269 | 787 |
| Conductive Adhesive | 79.3 | 79.0 | 193 | 472 | 640 |
| Solder | 10.7 | 5.55 | 9.72 | 39.8 | 95.7 |
| Control | 96.0 | 87.5 | 287 | 2090 | 5950 |

EXAMPLE 8

Example 8 shows the screening performance of a recoverable knitted fabric. A V-bed weft knitting machine having 5 needles/inch (2 needles/cm) was used to form a loose coarse fabric from a multifilament wire consisting of 7 strands of 40 a.w.g. tinned copper. These fibres were knitted in a rib pattern. A straight weft insertion of recoverable high density polyethylene monofilament of 0.2 mm diameter irradiated to a dose of 17 Mrad, resulted in the fabric having a usable recovery ratio of 3:1. In fact, the fabric would recover to a higher degree, but with some wrinkling.

The screening performance is shown in Table 8.

TABLE 8

| Frequency (KHz) | $Z_T$ (mohm/m) |
| --- | --- |
| 1 | 275 |
| 100 | 269 |
| 1000 | 378 |
| 10000 | 588 |
| 30000 | 808 |

These figures shown that acceptable results may easily be obtained using knitting. The performance here is, of course, lower than most of the weaves discussed due simply to the looseness of the knit.

What is claimed is:

1. An article capable of screening an electrical component, which comprises:
   (a) a recoverable fabric having as a component thereof fibres comprising an electrically conductive material; and
   (b) means for electrically terminating said fibres, said article after recovery having a surface transfer impedance of 5 ohm/m or less, measured over a frequency of from 1 to 50 MHz.
2. An article according to claim 1, in which said surface transfer impedance is 40 mohm/m or less.
3. An article according to claim 1, in which the fabric comprises a weave, the weft of which comprises the recoverable fibres and the warp comprises the fibre comprising the conductive material.
4. An article according to claim 1, in which the fabric comprises a warp or weft inserted knit, recoverable by virtue of a recoverable fiber insertion.
5. An article according to claim 1, in which the optical coverage of the fabric by the conductive material after recovery is at least 70%.
6. An article according to claim 1, wherein the article is in the form of a wrap-around sleeve.
7. An article according to claim 1, in which the means for electrically terminating comprises a mechanical clamp which has an electrically conductive surface in contact with said conductive material.
8. An article according to claim 1, in which the means for terminating comprises a recoverable driver member, exhibiting a recovery force per unit area greater than that of said fabric.
9. An article according to claim 1, in which the means for terminating comprises an electrically conductive sealing material.
10. An article according to claim 9 in which said sealing material comprises a solder, heat-softenable sealant or a hot-melt adhesive.
11. An article according to claim 9, in which the sealing material is heat-activatable and the fabric is heat-recoverable, the activation temperature of the sealing material differing from the recovery temperature of the fabric by 20° or less.
12. An article according to claim 1, in which said means for terminating is attached to the fabric.
13. An article according to claim 12 in which said means for terminating comprises solder fibres in the fabric.
14. An article according to claim 1, in which the fabric additionally comprises a laminate of a polymeric material, thereby rendering the fabric impervious.

* * * * *